(12) United States Patent
Vogelsang

(10) Patent No.: US 9,361,960 B2
(45) Date of Patent: Jun. 7, 2016

(54) CONFIGURABLE MEMORY BANKS OF A MEMORY DEVICE

(75) Inventor: Thomas Vogelsang, Mountain View, CA (US)

(73) Assignee: RAMBUS INC., Sunnyvale, CA (US)

( * ) Notice: Subject to any disclaimer, the term of this patent is extended or adjusted under 35 U.S.C. 154(b) by 767 days.

(21) Appl. No.: 13/394,533

(22) PCT Filed: Aug. 23, 2010

(86) PCT No.: PCT/US2010/046269
§ 371 (c)(1),
(2), (4) Date: Mar. 6, 2012

(87) PCT Pub. No.: WO2011/034686
PCT Pub. Date: Mar. 24, 2011

(65) Prior Publication Data
US 2012/0166753 A1    Jun. 28, 2012

Related U.S. Application Data

(60) Provisional application No. 61/243,114, filed on Sep. 16, 2009.

(51) Int. Cl.
*G06F 12/00* (2006.01)
*G11C 8/12* (2006.01)
*G11C 7/10* (2006.01)
(Continued)

(52) U.S. Cl.
CPC .............. *G11C 8/12* (2013.01); *G11C 7/1012* (2013.01); *G11C 7/1045* (2013.01); *G11C 11/4087* (2013.01); *G11C 11/4096* (2013.01); *G11C 2207/002* (2013.01); *G11C 2207/105* (2013.01)

(58) Field of Classification Search
CPC ..... G06F 12/023; G06F 3/067; G06F 9/0516; G06F 3/0631
USPC .......................................................... 711/170
See application file for complete search history.

(56) References Cited

U.S. PATENT DOCUMENTS 5,142,638 A * 8/1992 Schiffleger .................... 711/151
5,940,852 A   8/1999 Rangasayee et al.
6,049,223 A   4/2000 Lytle et al.
(Continued)

FOREIGN PATENT DOCUMENTS

JP    06-250935 A    9/1994
JP    2008-084052 A  4/2008
JP    2008-112503 A  5/2008

OTHER PUBLICATIONS

Rambus Inc., International Search Report and Written Opinion, PCT/US2010/046269, Apr. 28, 2010, 8 pages.

*Primary Examiner* — Charles Rones
*Assistant Examiner* — Nanci Wong
(74) *Attorney, Agent, or Firm* — Morgan, Lewis & Bockius LLP

(57) ABSTRACT

A memory device has a storage array having a plurality of accessible memory banks and a configurable first set of memory segments. The plurality of accessible memory banks include a second set of memory segments. During a first mode of operation, the first set of memory segments is configured to be an additional accessible memory bank. During a second mode of operation, a pair of memory segments in the first set of memory segments are configured to be an additional set of memory segments in each of the plurality of accessible memory banks.

26 Claims, 9 Drawing Sheets

(51) Int. Cl.
  *G11C 11/408* (2006.01)
  *G11C 11/4096* (2006.01)

(56) References Cited

U.S. PATENT DOCUMENTS

| | | | |
|---|---|---|---|
| 6,279,084 B1* | 8/2001 | VanDoren et al. | 711/141 |
| 7,117,421 B1* | 10/2006 | Danilak | 714/763 |
| 7,240,160 B1* | 7/2007 | Hetherington et al. | 711/122 |
| 2001/0050876 A1* | 12/2001 | Ishikawa | G11C 8/12 |
| | | | 362/230.03 |
| 2002/0105853 A1* | 8/2002 | Naven | 365/233 |
| 2005/0157579 A1 | 7/2005 | Perego et al. | |
| 2006/0092708 A1* | 5/2006 | Kawai et al. | 365/185.21 |
| 2007/0033369 A1* | 2/2007 | Kasama et al. | 711/170 |
| 2007/0133291 A1* | 6/2007 | Fukuda et al. | 365/185.17 |
| 2007/0263457 A1* | 11/2007 | Park | 365/185.33 |
| 2008/0177931 A1* | 7/2008 | Isaac et al. | 711/103 |
| 2008/0189467 A1* | 8/2008 | Ikeda et al. | 711/5 |
| 2008/0320203 A1* | 12/2008 | Fitzgerald | G06F 1/3225 |
| | | | 711/5 |
| 2009/0097348 A1* | 4/2009 | Minzoni et al. | 365/230.03 |
| 2009/0213645 A1 | 8/2009 | Parkinson et al. | |
| 2010/0091537 A1* | 4/2010 | Best et al. | 365/51 |
| 2010/0214842 A1* | 8/2010 | Honda | 365/185.18 |

* cited by examiner

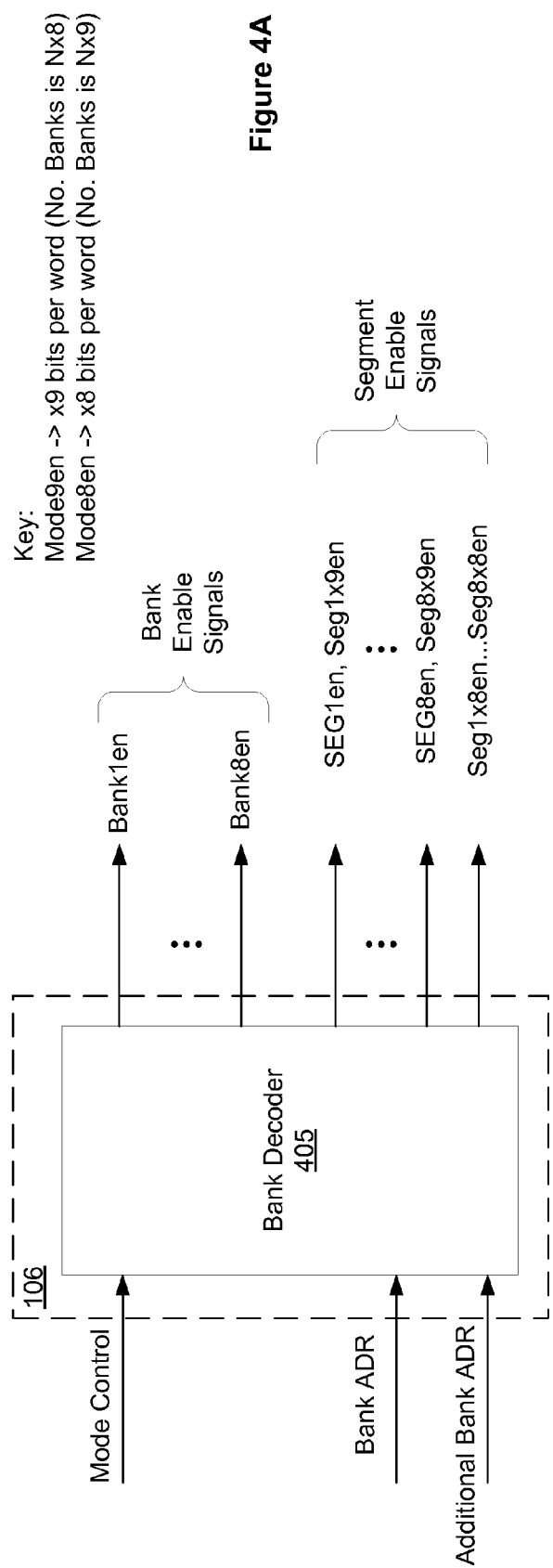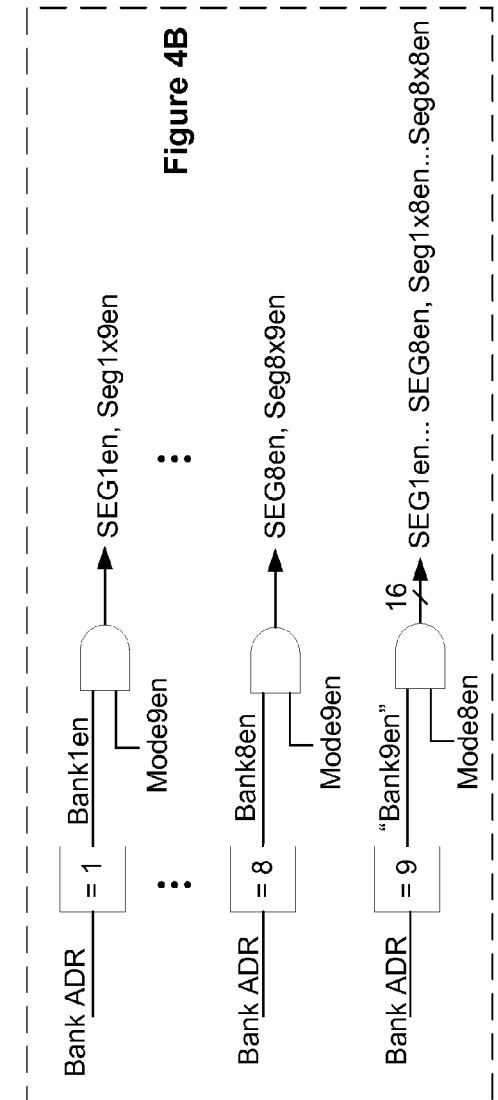

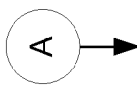

Operating the storage array in a second mode of operation, in which at least one memory segment in the first set of memory segments is accessed in parallel with a corresponding one of the plurality of memory banks. 530

In the second mode of operation, accessing a pair of memory segments in the first set of memory segments as an additional set of memory segments in a corresponding one of the plurality of memory banks 532

In the second mode of operation, accessing a respective memory segment in the first set of memory segments as an additional memory segment in a corresponding one of the plurality of memory banks 534

In the second mode of operation, storing error correction codes in the first set of memory segments 536

In the second mode of operation, at least one memory segment of the first and second sets of memory segments is used to store error correction codes 538

Figure 5B

CONFIGURABLE MEMORY BANKS OF A MEMORY DEVICE

CROSS REFERENCE TO RELATED APPLICATIONS

This Application is a United States National Stage Application filed under 35 U.S.C. §371 of PCT Patent Application Serial No. PCT/US2010/046269 filed on Aug. 23, 2010, which claims the benefit of and priority to U.S. Provisional Patent Application Ser. No. 61/243,114 filed on Sep. 16, 2009, both of which are hereby incorporated by reference in their entireties.

TECHNICAL FIELD

The subject matter disclosed herein relates generally to memory systems having memory modules. More specifically, the subject matter relates high-speed memory modules with configurable banks.

BACKGROUND

The main operating memory of virtually all modern desktop and laptop computers is implemented using dynamic random access memory (DRAM) components. DRAM is relatively inexpensive and provides excellent storage density relative to other types of semiconductor memory. The internal column and data path structure of a DRAM, however, puts severe restrictions on the granularity of data access, making flexible memory systems difficult to design.

BRIEF DESCRIPTION OF THE DRAWINGS

FIGS. 4A-B are block diagrams of logic for generating control signals in accordance with some embodiments.

FIGS. 5A-5B are a flow diagram of a method of operating a memory module in accordance with some embodiments.

Like reference numerals refer to corresponding parts throughout the drawings.

DESCRIPTION OF EMBODIMENTS

Figure 1:
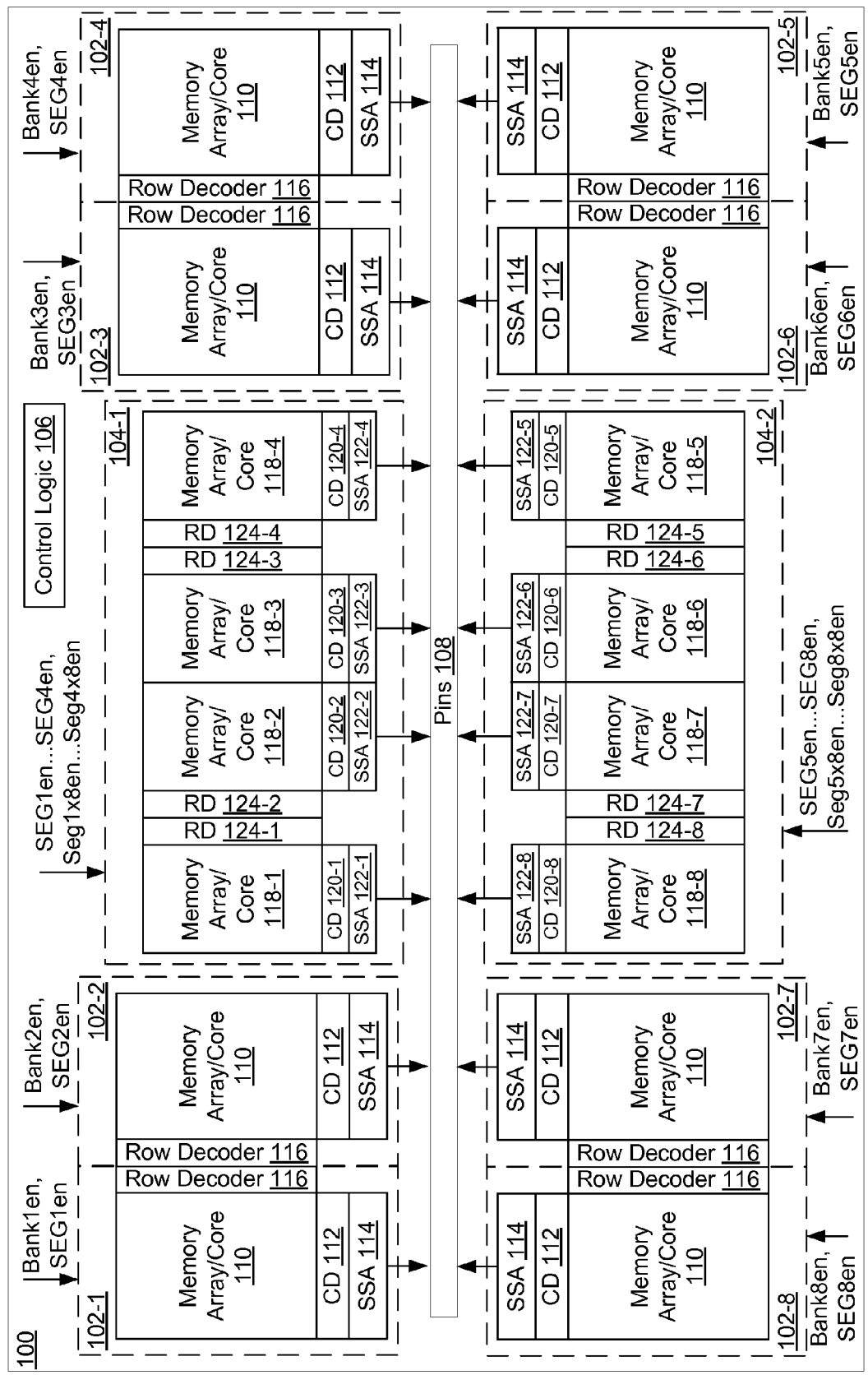
FIG. 1 is a block diagram illustrating a portion of a memory device in accordance with some embodiments.

A memory device has a storage array having a plurality of accessible memory banks and, in addition, a configurable first set of memory segments. The plurality of accessible memory banks include a second set of memory segments. During a first mode of operation, the first set of memory segments is configured to be an additional accessible memory bank. During a second mode of operation, at least one memory segment in the first set of memory segments is configured to be accessed in parallel with a corresponding one of the plurality of accessible memory banks.

In some embodiments, during the second mode of operation, each memory segment in the first set of memory segments is configured to be an additional segment of a corresponding one of the plurality of memory banks.

In some embodiments, each memory segment in the first set of memory segments is coupled to a distinct word line driver. In some embodiments, each memory segment in the first set of memory segments has its own row decoder, each of which includes a respective word line driver. In other embodiments, the first set of memory segments includes a plurality memory segment pairs and each respective memory segment pair in the first set of memory segments is coupled to a respective word line driver.

In some embodiments, the first set of memory segments are used to store error correction or error detection codes during the second mode of operation. Alternately, in some embodiments, at least one memory segment of the first and second sets of memory segments is used to error correction or error detection codes during the second mode of operation.

In some embodiments, the memory device includes mode control circuitry coupled to the storage array to generate distinct control signals for each of the memory banks in the plurality of accessible memory banks and for each of the memory segments in the first set of memory segments. In some embodiments, the mode control circuitry is configured to generate two sets of control signals for the first set of memory segments, including a first set of control signals for the first mode of operation and a second set of control signals for the second mode of operation.

In some embodiments, the memory device includes a number of data pins that are coupled to the storage array, wherein the number of data pins is equal to a number of simultaneously accessed data bits in the second mode of operation. In some embodiments, at least one of the number of data pins is disabled in the first mode of operation.

A memory device has a first number of accessible memory banks in a first mode of operation and a second number of accessible memory banks in a second mode of operation. During the first mode of operation, each of the first number of accessible memory banks is comprised of a first number of memory segments and during the second mode of operation, each of the second number of accessible memory banks is comprised of a second number of memory segments. The first number of accessible memory banks is greater than the second number of accessible memory banks, and the second number of memory segments is greater than the first number of memory segments.

In some embodiments, the memory device includes mode control circuitry that is coupled to the storage array to generate distinct control signals for the first mode of operation and the second mode of operation.

In some embodiments, the memory device also includes a number of data pins that are coupled to the storage array, wherein the number of data pins is equal to a number of simultaneously accessed data bits in the second mode of operation. In some embodiments, at least one of the number of data pins is disabled in the first mode of operation.

In some embodiments, at least one memory segment in each of the second number of accessible memory banks is used to store error correction or error detection codes in the second mode of operation.

A method of operating a memory module includes providing a storage array having a plurality of memory banks and a first set of memory segments, using the first set of memory segments as an additional memory bank in a first mode of operation, and accessing a memory segment in the first set of memory segments in parallel with a corresponding one of the plurality of memory banks in a second mode of operation. Each of the plurality of memory banks includes a second set of memory segments.

In some embodiments, the method further includes accessing a pair of memory segments in the first set of memory segments as an additional set of memory segments in a corresponding one of the plurality of memory banks in the second mode of operation. Alternately, the method further includes accessing a respective memory segment in the first set of memory segments as an additional memory segment in a corresponding one of the plurality of memory banks in the second mode of operation.

In some embodiments, the method further includes generating distinct control signals for each of the memory banks in the plurality of memory banks and for each of the memory segments in the first set of memory segments. In some embodiments, the method further includes generating two sets of control signals for the first set of memory segments, including a first set of control signals for the first mode of operation and a second set of control signals for the second mode of operation.

In some embodiments, the method further includes providing a number of data pins coupled to the storage array, wherein the number of data pins is equal to a number of simultaneously accessed data bits in the second mode of operation. In some embodiments, the method includes disabling at least one of the number of data pins in the first mode of operation.

In some embodiments, the method includes storing error correction or error detection codes in the first set of memory segments in the second mode of operation. Alternately, the method includes storing error correction or error detection codes in one of the first and second sets of memory segments in the second mode of operation.

A method of operating a memory device having a memory core includes, in a first mode of operation, configuring the memory core such that the memory device is comprised of a first number of accessible memory banks and that each of the first number of accessible memory banks is comprised of N1 memory segments, where N1 is a positive integer, and accessing data stored in the memory core in the form of first data words each including M1*N1 bits, where M1 is a positive integer. The method also includes, in a second mode of operation, configuring the memory core such that the memory device is comprised of a second number of accessible memory banks and that each of the second number of accessible memory banks is comprised of N2 memory segments, where N2 is a positive integer, and accessing data stored in the memory core in the form of first data words each including M2*N2 bits, where M2 is a positive integer. The first number of accessible memory banks is greater than the second number of accessible memory banks, and N2 is greater than N1. In some embodiments, a mode control signal is received from a controller, where the mode control signal is used to enable one of the first mode of operation or the second mode of operation.

Reference will now be made in detail to embodiments, examples of which are illustrated in the accompanying drawings. In the following detailed description, numerous specific details are set forth in order to provide a thorough understanding of the present invention. It will be apparent, to one of ordinarily skill in the art, however, that the present invention may be practiced without these specific details. In other instances, well-known methods, procedures, components, and circuits have not been described in detail so as not to unnecessarily obscure aspects of the embodiments.

FIG. 1 is a block diagram illustrating a memory device 100 in accordance with some embodiments. In some embodiments, the memory device is a dynamic random access memory (DRAM) component. The memory device 100 can be part of a larger electronic system. In some embodiments, memory device 100 is coupled to a microprocessor and provides data retrieved from the plurality of memory banks 102 and the plurality of supplementary segments 104 to the microprocessor via pins 108.

The memory device 100 supports two modes of operation. In a first mode of operation, data can be accessed as a multiple of 8 bits per word, and in a second mode of operation, data is accessed as a multiple of 9 bits per word. The first mode of operation is referred to herein as the "×8 mode" and the second mode of operation is referred to herein as the "×9 mode." In the ×8 mode, the memory device 100 is configured to have a multiple of 9 memory banks (i.e., the number of memory banks is equal to M×9, where M is an integer greater than 0). In the ×9 mode, the memory device 100 is configured to have a multiple of 8 memory banks (i.e., the number of memory banks is equal to N×8, where N is an integer greater than 0). In the following description, memory device 100 is referred to as being able to access data comprised of both 8 and 9 bits per word. One skilled in the art will recognize, however, that a memory device as described herein would be suitable to access data comprised of any multiple of 8 and 9 bits per word by merely multiplying the described components, or by increasing the data width of the described components.

Figure 3A:
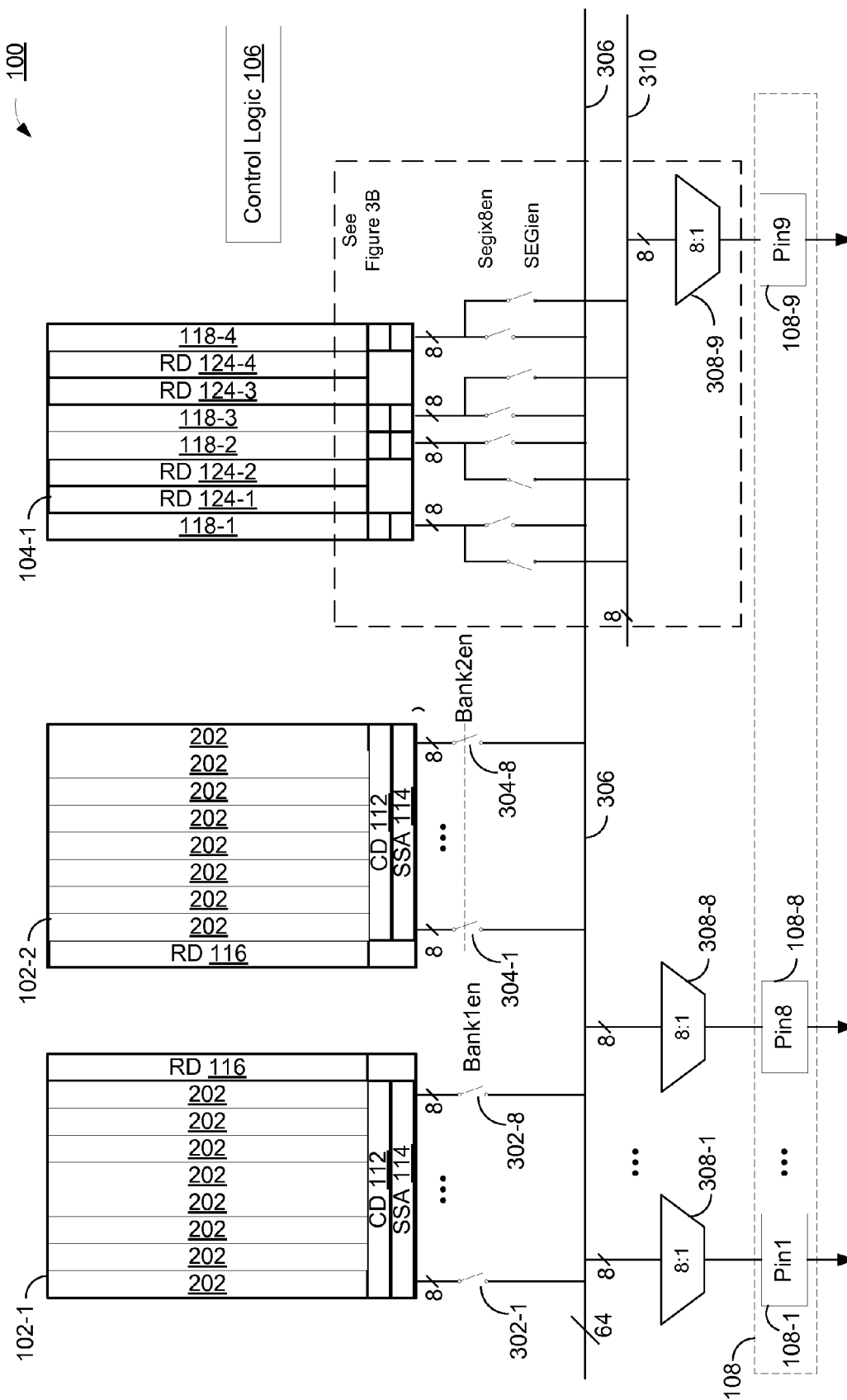
FIGS. 3A-B are schematic diagrams of portions of a memory device in accordance with some embodiments.

As shown in FIG. 1, the memory device 100 includes a plurality of memory banks 102-1, 102-2, . . . 102-8, a set of supplementary segments including a plurality of supplementary segments 104-1 and a plurality of supplementary segments 104-2, control logic 106, and pins 108. In some embodiments, memory device 100 may also include other components not shown in FIG. 1. As detailed in FIG. 3A, pins 108 are comprised of a plurality of data pins 108-1 . . . 108-9 (FIG. 3A). As discussed further below in relation to FIGS. 4A and 4B, various control signals (e.g., bank enable signals and segment pair enable signals) are generated by control logic 106.

Each of the plurality of memory banks 102-1 . . . 102-8 include at least a memory array/core 110, column decoder (CD) 112, secondary sense amplifiers (SSA) 114, and row decoder (RD) 116. Each of the plurality of memory banks 102-1 . . . 102-8 receives a plurality of control signal (e.g., Bank1en . . . Bank8en) from control logic 106 that enables its operation. Column decoder CD 112 and row decoder RD 116 receive and decode address signals when enabled by a bank enable signal received from control logic 106. The address signals and bank enable signal together identify which bank should be enabled and which row/column of the enabled bank to access. As discussed further below in relation to FIG. 3C, each row decoder RD 116 uses address signals and a respective control signal (i.e., bank enable signal) to generate word line signals. Secondary sense amplifiers SSA 114 sense data located in the accessed locations of the enabled bank and send the sensed data to pins 108 in a read operation. In a write operation, write circuitry (not shown) parallel to secondary sense amplifiers SSA 114 sends data from the pins 108 to the memory array 110. In some embodiments, additional circuitry processes the data between the memory array 110 and the pins 108 in both read and write operations.

The plurality of supplementary segments 104-1 and supplementary segments 104-2 each include a plurality of memory arrays/cores 118-1 . . . 118-4 and 118-5 . . . 118-8, respectively, a plurality of column decoders CD 120-1 . . .

120-4 and CD 120-5 . . . 120-8, respectively, a plurality of supplemental sense amplifiers SSA 122-1 . . . 122-4 and SSA 122-5 . . . 122-8, respectively, and a plurality of RD 124-1 . . . 124-4 and 124-5 . . . 124-8, respectively. Each of these components is similar to the corresponding component of each of the plurality of memory banks 102-1 . . . 102-8. For example, the plurality of row decoders RD 124-1 . . . 124-4 and RD 124-5 . . . 124-8 are similar to row decoder RD 116. In some embodiments, each of the plurality of memory arrays/cores 118-1 . . . 118-8 has its own row decoder. In other embodiments, a row decoder is shared by one or more of the plurality of memory arrays/cores 118-1 . . . 118-8. The plurality of supplementary segments 104-1 and supplementary segments 104-2 each receive a plurality of control signals (e.g., SEG1en . . . SEG4en and SEG5en . . . SEG8en, respectively, and SEG1×8en . . . Seg4×8en and Seg5×8en and Seg8×8en, respectively) from control logic 106.

Figure 2A:
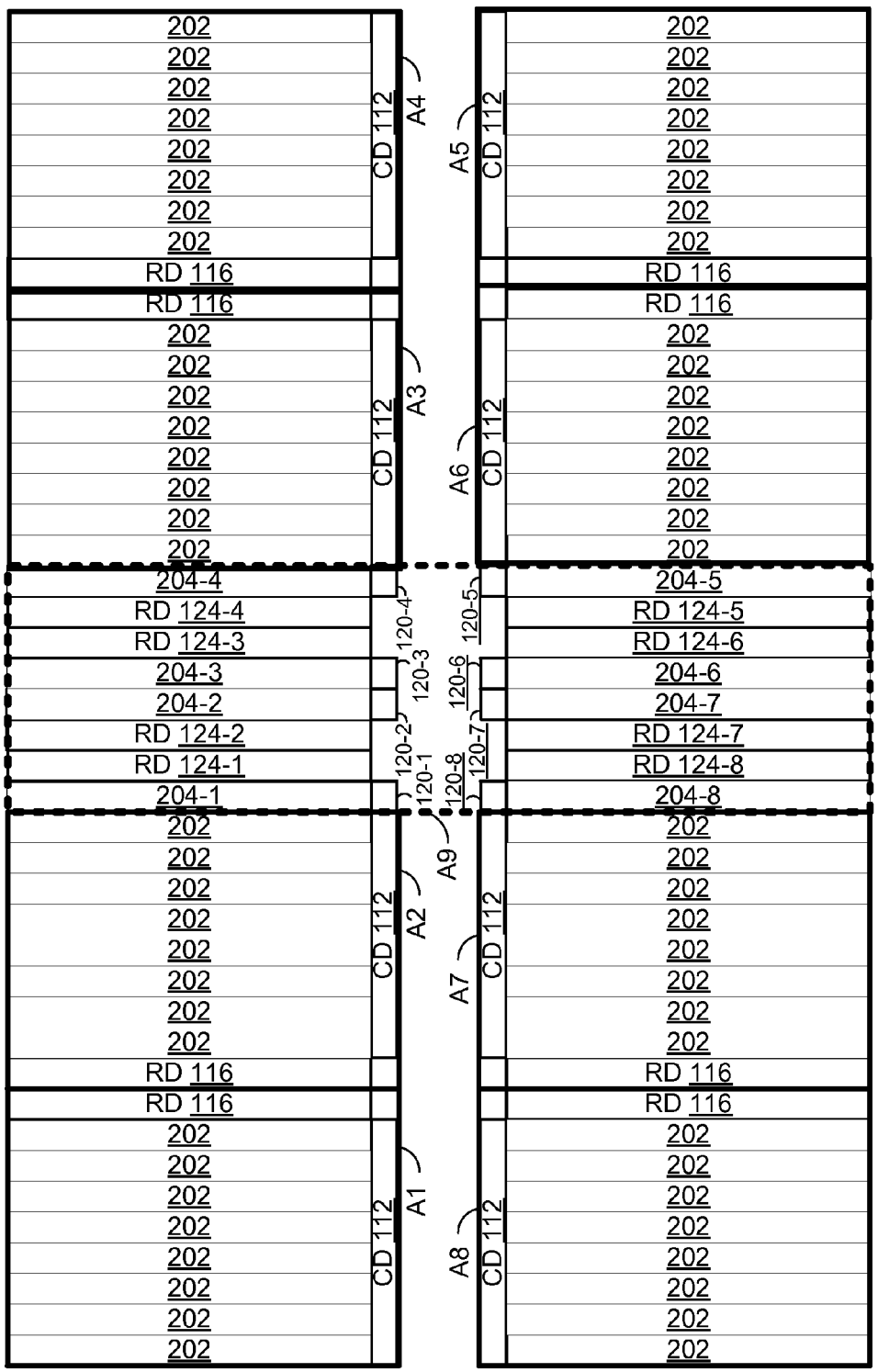
FIG. 2A is a block diagram of a memory device in ×8 mode in accordance with some embodiments.

In the ×8 mode, the supplementary segments 104-1 and supplementary segments 104-2 are configured to be a ninth memory bank. The ×8 mode configuration is described in more detail in connection with FIG. 2A. As shown in FIG. 2A, memory device 100×8 includes a plurality of memory banks A1 . . . A9. Memory banks A1 . . . A8 are memory banks 102-1 . . . 102-8 (FIG. 1), and as such, memory banks A1 . . . A8 each include a column decoder CD 112 and row decoder RD 116. Each memory bank A1 . . . A8 also includes a plurality of memory segments 202, which are components of the memory bank's memory array/core 110 (FIG. 1). As stated above, in the ×8 mode, the supplementary segments 104-1 and supplementary segments 104-2 are configured to be a ninth memory bank (i.e., memory bank A9). Memory bank A9 includes a plurality of memory segments 204-1 . . . 204-8 (corresponding to memory arrays/cores 118-1 . . . 118-8 in FIG. 1), the plurality of row decoders RD 124-1 . . . 124-8, and the plurality of column decoders CD 120-1 . . . 120-8. As described in further detail below in connection with FIGS. 3A and 3B, when one of the plurality of memory banks A1 . . . A8 or memory bank A9 is enabled in ×8 mode, the memory segments in the enabled memory bank are accessed simultaneously and the accessed data is sent to (or received from) pins 108 (FIG. 1).

Returning to FIG. 1, in the ×9 mode, at least one of the plurality of memory arrays/cores 118-1 . . . 118-8 in supplementary segments 104-1 and supplementary segments 104-2) is configured to be accessed in parallel with a corresponding one of the memory banks 102-1 . . . 102-8. The ×9 mode configuration is described in more detail in connection with FIG. 2B.

Figure 2B:
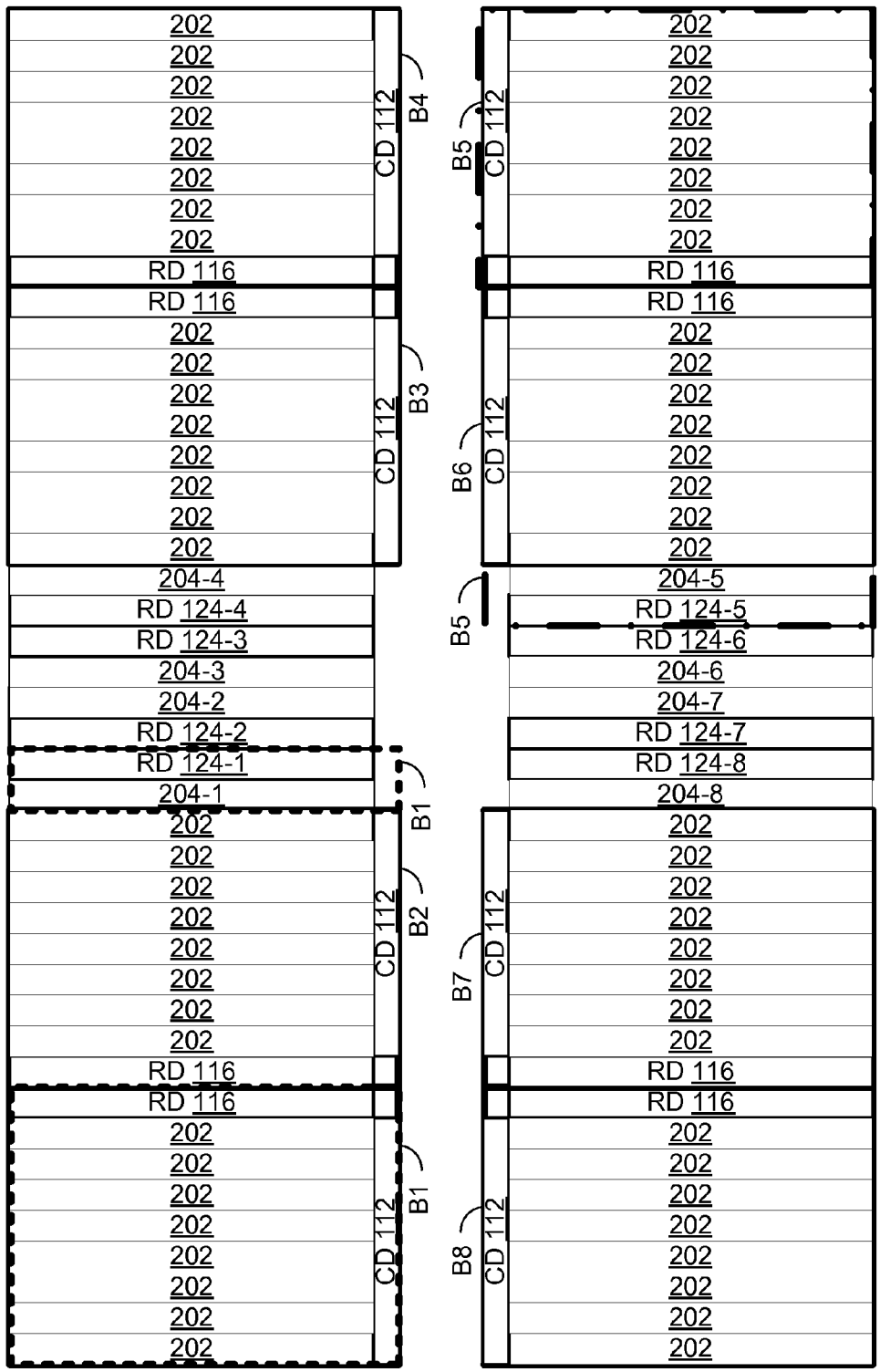
FIG. 2B is a block diagram of a memory device in ×9 mode in accordance with some embodiments.

As shown in FIG. 2B, memory device 100×9 includes a plurality of memory banks B1 . . . B8. Memory banks B1 . . . B8 are memory banks 102-1 . . . 102-8 (FIG. 1), and as such, memory banks B1 . . . B8 each include a column decoder CD 112 and row decoder RD 116. Each memory bank B1 . . . B8 also includes a plurality of memory segments 202, which are components of the memory bank's memory array/core 110 (FIG. 1). Memory device 100×9 further includes a plurality memory segments 204-1 . . . 204-8 (i.e., the plurality of memory arrays/cores 118-1 . . . 118-8), each of which has a corresponding column decoder CD 120 (not shown in FIG. 2B) and row decoder RD 124-1 . . . 124-8. When one of the memory banks B1 . . . B8 is enabled, a corresponding one of the memory segments 204-1 . . . 204-8 is accessed in parallel with the enabled bank. Accordingly, the accessed memory segment acts as a supplementary memory segment for the enabled memory bank. For example, in some embodiments, when memory bank B1 is enabled, memory segment 204-1 is also accessed. Additionally, in some embodiments, when memory bank B5 is enabled, memory segment 204-5 is also accessed. As described below in connection with FIGS. 3A and 3B, when one of the plurality of memory banks B1 . . . B8 is accessed in ×9 mode, one of the plurality of memory segments 204-1 . . . 204-8 is also accessed, and the accessed data from both the accessed memory bank and the accessed memory segment is sent to pins 108 (FIG. 1). Stated another way, in ×9 mode, each bank includes both a main set of memory segments 202 and at least one supplemental memory segment 204.

In some embodiments, when the memory device 100 is operated in ×9 mode, the supplemental memory segments 204 (memory arrays/cores 118-1 . . . 118-8) store error correction or error detection codes. Specifically, the plurality of memory arrays/cores 118-1 . . . 118-8 store parity bits or error correction or error detection codes. In other embodiments, when the memory device 100 is operated in ×9 mode, at least one memory segment 202 or memory segment 204 of each memory bank is used to store error correction or error detection codes. In the latter embodiments, the error correction or error detection codes need not be stored in the supplemental memory segments 204, and FIGS. 3A and 3B illustrate a portion of the memory device 100 in accordance with some embodiments. As shown in FIG. 3A, memory banks 102-1 and 102-2 are coupled to bus 306 via switches 302-1 . . . 302-8 and 304-1 . . . 304-8, respectively. Switches 302-1 . . . 302-8 are controlled by bank control signal Bank1en and switches 304-1 . . . 304-8 are controlled by bank control signal Bank2en. As described further below in connection with FIGS. 4A and 4B, control logic 106 generates a plurality of bank control signals, including Bank1en and Bank2en. While only two memory banks (i.e., memory banks 102-1 and 102-2) are shown in FIG. 3A, each of the remaining memory banks of the plurality of memory banks (i.e., memory banks 102-3 . . . 102-8) is also coupled to bus 306 via a similar set of switches controlled by a bank control signal received from control logic 106.

Pins 108 include a plurality of data pins 108-1 . . . 108-9. Eight of the data pins 108-1 . . . 108-8 are coupled to bus 306 via a corresponding plurality of multiplexors 308-1 . . . 308-9. The ninth data pin 108-9 is coupled to bus 310 by a multiplexor 308-9. In some embodiments, data pin 108-9 is disabled in ×8 mode (e.g., by tri-stating the inputs to multiplexor 308-9, or by disabling multiplexor 308-9 with the a mode signal).

FIG. 3B illustrates in detail how supplementary segment 104-1 is coupled to bus 306 (for conveying data to and from the first eight pins 108-1 to 108-8) and bus 310 (for conveying data to and from the ninth pin 108-9) in accordance with some embodiments. As also shown in FIG. 3B, supplementary segment 104-1 includes a plurality of memory segments 118-1 . . . 118-4, a plurality of row decoders 124-1 . . . 124-4, a plurality of column decoders 120-1 . . . 120-4, and a plurality of secondary sense amplifiers 122-1 . . . 122-4. Supplementary segment 104-1 is coupled to a plurality of switches 312-1 . . . 312-4 and 314-1 . . . 314-4. More specifically, in this example supplementary segment 104-1 is coupled to two sets of switches, one (312-1 . . . 312-4) for coupling the supplementary segment 104-1 to bus 306, and the other (314-1 . . . 314-4) for coupling the supplementary segment 104-1 to bus 310.

A first set of switches 312-1 . . . 312-4 couple supplementary segment 104-1 to bus 306 (which is coupled to the first eight pins, 108-1 . . . 108-8) and are controlled by Seg1×8en . . . Seg4×8en. In this example, each switch 312 couples eight parallel data lines (carrying data to or from the memory array 118 in a respective memory segment 204) of the supplementary segment 104-1 to the bus 306. Because supplementary segment 104-2 (FIG. 1) is essentially a mirror image of supplementary segment 104-1, supplementary segment 104-2 (FIG. 1) is coupled to bus 306 via a plurality of switches 312-5 . . . 312-8 (not shown) that are controlled by Seg5×8en . . . Seg8×8en (FIG. 1), respectively. When the memory device 100 (FIG. 1) is operating in the ×8 mode and Bank 9 (i.e., memory bank A9) is enabled, the plurality of switches 312-1 . . . 312-4 and 312-5 . . . 312-8 (not shown) are also enabled. As such, each of the plurality of memory segments 118-1 . . . 118-8 is accessed when Bank 9 is enabled.

A second set of switches 314-1 . . . 314-4 couple supplementary segment 104-1 to bus 310 (which is coupled to the ninth pin, 108-9). Switch 314-1 is controlled by SEG1×9en, switch 314-2 is controlled by SEG2×9en, switch 314-3 is controlled by SEG3×9en, and switch 314-4 is controlled by SEG4×9en. In this example, each switch 314 couples eight parallel data lines (carrying data to or from the memory array 118 in a respective memory segment 204) of the supplementary segment 104-1 to the bus 310. Because supplementary segment 104-2 (FIG. 1) is essentially a mirror image of supplementary segment 104-1, supplementary segment 104-2 (FIG. 1) is coupled to bus 310 via a plurality of switches 314-5 . . . 314-8 (not shown) that are controlled by Seg5×9en . . . Seg8×9en (FIG. 1), respectively. When the memory device 100 (FIG. 1) is operating in the ×9 mode, only one of switches 314-1 . . . 314-8 is enabled, and thus, only the corresponding memory segment of the plurality of memory segments 204-1 . . . 204-8 (is accessed.

Seg1×8en . . . Seg8×8en and SEG1en . . . SEG8en are generated by control logic 106 (FIG. 3A) as described below in connection with FIGS. 4A and 4B.

The operation of memory banks 102-1 . . . 102-8 is the same irrespective of what mode the memory device 100 is operating in. In ×8 mode, only one of the plurality of memory banks A1 . . . A9 (FIG. 2A) is enabled at any one time. In ×9 mode, one of the plurality of memory banks B1 . . . B8 (FIG. 2B) and one of the plurality of memory segments 204-1 . . . 204-8 are enabled at the same time.

For example, in ×8 mode, only switches 302-1 . . . 302-8 are engaged when memory bank A1 (i.e., memory bank 102-1) is enabled. The 8 bits of data recovered from memory bank 102-1 are sent to bus 306 and then to the corresponding data pins 108-1 . . . 108-8. Also for example, in ×8 mode, when memory bank A9 (i.e., supplementary segments 104-1 and supplementary segments 104-2) is enabled, switches 312-1 . . . 312-8 are enabled. Accordingly, all of the memory arrays/cores 118-1 . . . 118-8 (in memory segments 204-1 . . . 204-9) are accessed when memory bank A9 is accessed in the ×8 mode.

Also for example, in ×9 mode, switches 302-1 . . . 302-8 and switch 314-1 are engaged when memory bank B1 (i.e., memory bank 102-1) and memory array/core 118-1 (in memory segment 204-1) are enabled. Again, the 8 bits of data recovered from memory bank 102-1 are sent to bus 306 and then to the corresponding data pins 108-1 . . . 108-8. The additional data recovered from memory segment 204-1 (memory array/core 118-1) is sent to bus 310 and then to pin 9.

Figure 3C:
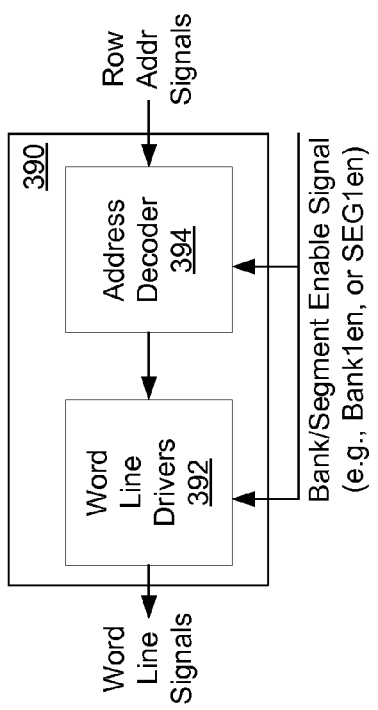
FIG. 3C is block diagram illustrating a row decoder in accordance with some embodiments.

FIG. 3C illustrates a row decoder RD 390 in accordance with some embodiments. RD 390 may be RD 116 (i.e., one of the memory bank row decoders) or one of the plurality of row decoders 124-1 . . . 124-8 (i.e., one of the segment row decoders). Row decoder RD 390 includes an address decoder 394 and word line drivers 392. Row decoder RD 390 generates word line signals by decoding a set of address signals (sometimes called the row address bits (Row Addr Signals)) when a corresponding bank enable signal (e.g., Bank1en) or segment enable signal (e.g., SEG1en) is active. The word line signals indicate the word line in the memory array/core (e.g., memory array/core 110) to be accessed. In some embodiments, each of the plurality of memory segments 118-1 . . . 118-8 have a dedicated word line driver 392. In other embodiments, a pair of the plurality of memory segments 118-1 . . . 118-8 share a word line driver 392.

Figure 3D:
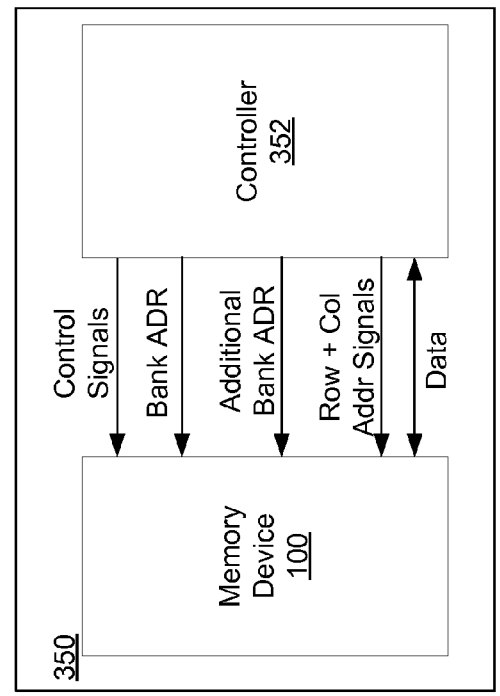
FIG. 3D is a block diagram illustrating a memory system in accordance with some embodiments.
Figure 3B:
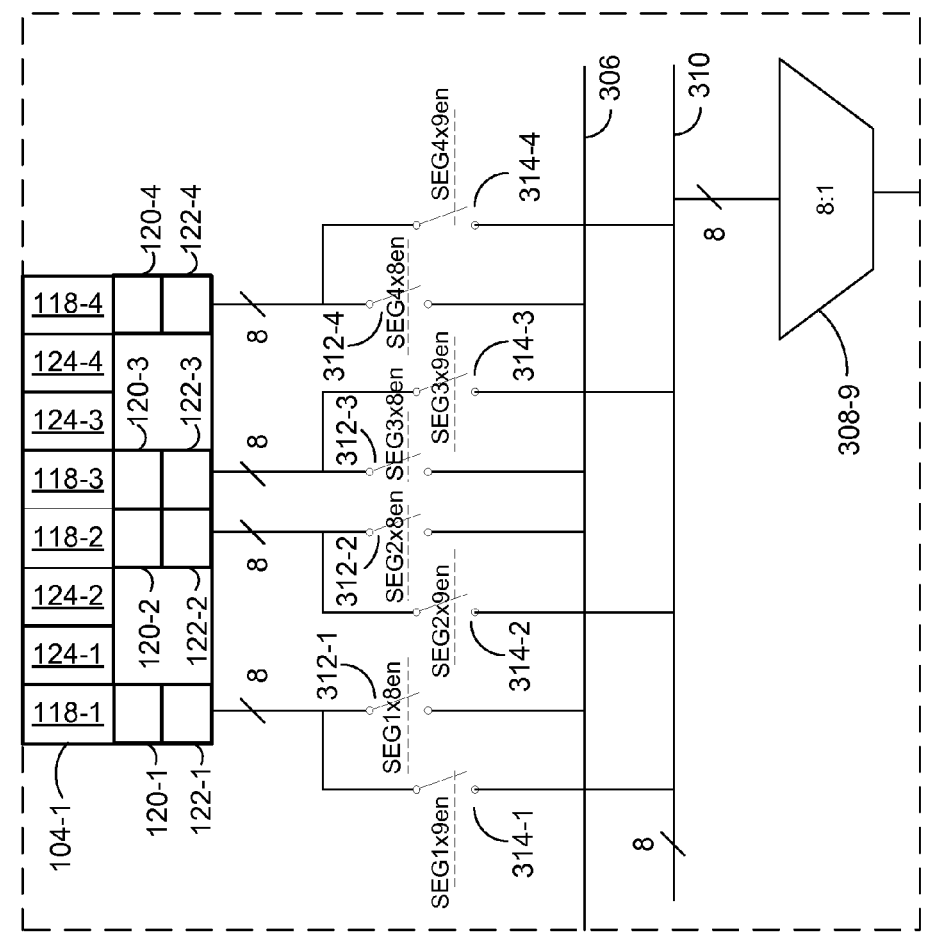

FIG. 3D illustrates a memory system 350 in accordance with some embodiments. As shown in FIG. 3D, the memory system includes memory device 100 and controller 352 (e.g., a memory controller or other system controller). The memory device 100 can be any of the memory devices shown in FIGS. 1, 2A-2B, and can incorporate the circuitry shown in FIGS. 3A-3C and the decoder circuitry of FIGS. 4A-4B. The memory device 100 and controller 352 are interconnected by control, address and data signal lines (sometimes called buses, or wired signal lines, or traces if on a printed circuit board, etc.) Memory device 100 receives a one or more control signals (e.g., a mode control signal, labeled Mode Control in other Figures), a bank address signal (Bank ADR), an additional bank address signal (Additional Bank ADR), and row and column address bits (Row+Col Addr Signals) from controller 352. Data signals are conveyed to the memory device 100 from the controller 352 when writing data to the memory device 100, and from the memory device 100 to the controller 352 when reading data from the memory device 100. As discussed further below in relation to FIGS. 4A and 4B, the mode control signal (Mode Control), the bank address signal (Bank ADR), and the additional bank address signal (Additional Bank ADR) are used by control logic 106 (FIG. 4A) to generate various control signals (e.g., bank enable signals and segment pair enable signals). As discussed above in relation to FIG. 3C, row decoder 390 uses row address bits (Row Addr Signals) to generate word line signals.

FIGS. 4A and 4B illustrate control logic 106 in accordance with some embodiments. As shown in FIG. 4A, control logic 106 generates the plurality of control signals used by the memory device 100 (FIG. 1). Control logic 106 comprises a bank decoder 405, which receives a mode control signal (Mode Control), a bank address signal (Bank ADR), and an additional bank address signal (Additional Bank ADR). As stated above in relation to FIG. 3D, the mode control signal (Mode Control), bank address signal (Bank ADR), and additional bank address signal (Additional Bank ADR) are received from controller 352 in some embodiments. Mode Control indicates what mode the memory device 100 (FIG. 1) is operating in. When the memory device 100 (FIG. 1) is operating in the ×8 mode, Mode Control is equal to Mode8en. When the memory device 100 (FIG. 1) is operating in the ×9 mode, Mode Control is equal to Mode9en. Bank ADR indicates what memory bank of the plurality of memory banks 102-1 . . . 102-8 (FIG. 1) should be accessed. Bank ADR is typically a multi-bit value, for example, a three, four or five bit value. Additional Bank ADR indicates what particular segment/word line of the accessed memory bank should be accessed. Additional Bank ADR is typically a single bit value (e.g., equal to 0 or 1).

Bank decoder 405 generates a plurality of bank enable signals Bank1en . . . Bank8en, which are used to enable the plurality of memory banks as described above in connection with FIG. 3A. Bank decoder 405 also generates a plurality of segment pair enable signals SEG1en, Seg1×9en . . . SEG8en, Seg8×9en and Seg1×8en . . . Seg8×8en. The bank enable signals and segment enable signals are used by the plurality of control switches 302-1 . . . 302-8 (FIG. 3A) and the plurality of row decoders RD 116 and 124-1 ... 124-8 (FIG. 1) to access data stored in the plurality of memory banks 102-1 ... 102-8 (FIG. 1).

As shown in FIG. 4B, when Bank ADR is equal to 1, Bank1en and SEG1en are generated. Similarly, Bank8en and SEG8en are generated when Bank ADR is equal to 8. When Mode Control is equal to Mode9en, Segix9en is also generated, where i identifies (or is equal to) the bank enabled. For example, Segix9en is Seg1x9en when Bank ADR is equal 1 and Segix9en is Seg8x9en when Bank ADR is equal to 8.

Additionally as shown in FIG. 4B, SEG1en ... SEG8en and Seg1x8en ... Seg8x8en are generated when Bank ADR is equal to 9 (and thus, "Bank9en" is generated) and Mode Control is equal to Mode8en. SEG1en ... SEG8en and Seg1x8en ... Seg8x8en are used to access specific segments of memory bank A9 (FIG. 2A). It is noted that the SEG1en ... SEG8en (SEGien) signals are each produced by two circuits, one for the x8 mode and one for the x9, and thus, in effect, each of the SEG1en ... SEG8en signals is produced by a logical OR of the outputs from those two circuits—when either circuit produces an active SEGien signal, the SEGien signal is active.

Figure 5A:
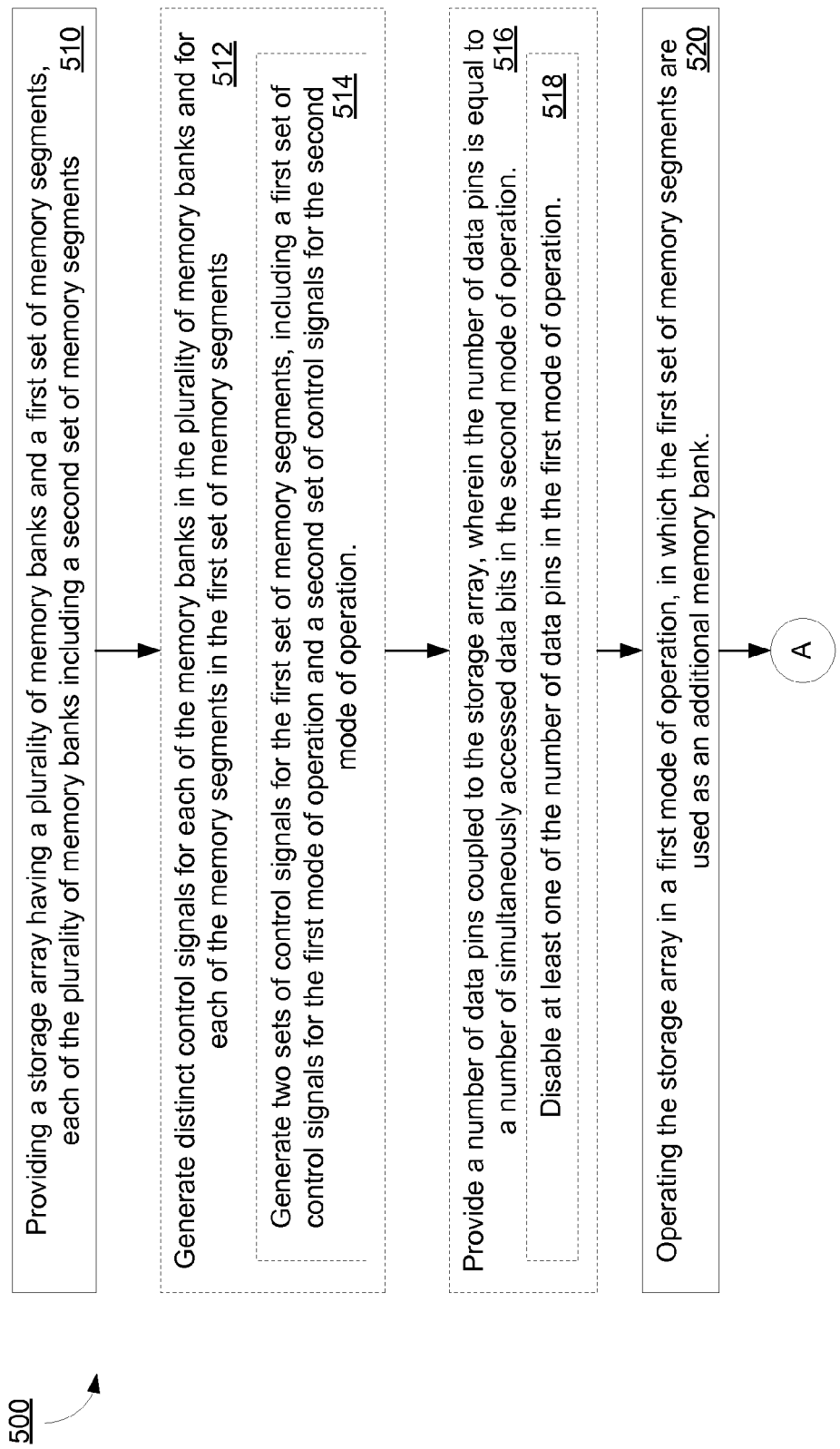

FIGS. 5A-5B are a flow diagram illustrating a process 500 of operating a memory module in accordance with some embodiments. Process 500 can be performed using the memory device 100 described above with reference to FIGS. 1-4B. As shown in FIGS. 5A-5B, the process 500 includes providing a storage array having a plurality of memory banks (e.g., memory banks 102-1 ... 102-8 (FIG. 1)) and a first set of memory segments (e.g., supplementary segments 104-1 and supplementary segments 104-2 (FIG. 1)), where each of the plurality of memory banks includes a second set of memory segments (e.g., memory segments 202 (FIG. 2A)) (510). The process 500 further includes operating the storage array in a first mode of operation, in which the first set of memory segments are used as an additional memory bank (520). The storage array is also operated in a second mode of operation, in which at least one memory segment in the first set of memory segments is accessed in parallel with a corresponding one of the plurality of memory banks (530).

In some embodiments, the method includes generating distinct control signals for each of the memory banks in the plurality of memory banks and for each of the memory segments in the first set of memory segments (512). For example, this may include generating two sets of control signals for the first set of memory segments, including a first set of control signals for the first mode of operation and a second set of control signals for the second mode of operation (514).

In some embodiments, the method includes providing a number of data pins coupled to the storage array, wherein the number of data pins is equal to a number of simultaneously accessed data bits in the second mode of operation (516). In addition, the method of may optionally include disabling at least one of the number of data pins in the first mode of operation (518).

In some embodiments, the method includes, in the second mode of operation, accessing a pair of memory segments in the first set of memory segments as an additional set of memory segments in a corresponding one of the plurality of memory banks (532). Alternately, the method includes, in the second mode of operation, accessing a respective memory segment in the first set of memory segments as an additional memory segment in a corresponding one of the plurality of memory banks (534).

In addition, in some embodiments the method includes, in the second mode of operation, storing error correction or error detection codes in the first set of memory segments (536). Alternately, in the second mode of operation, at least one memory segment of the first and second sets of memory segments is used to store error correction or error detection codes (538).

Figure 6:
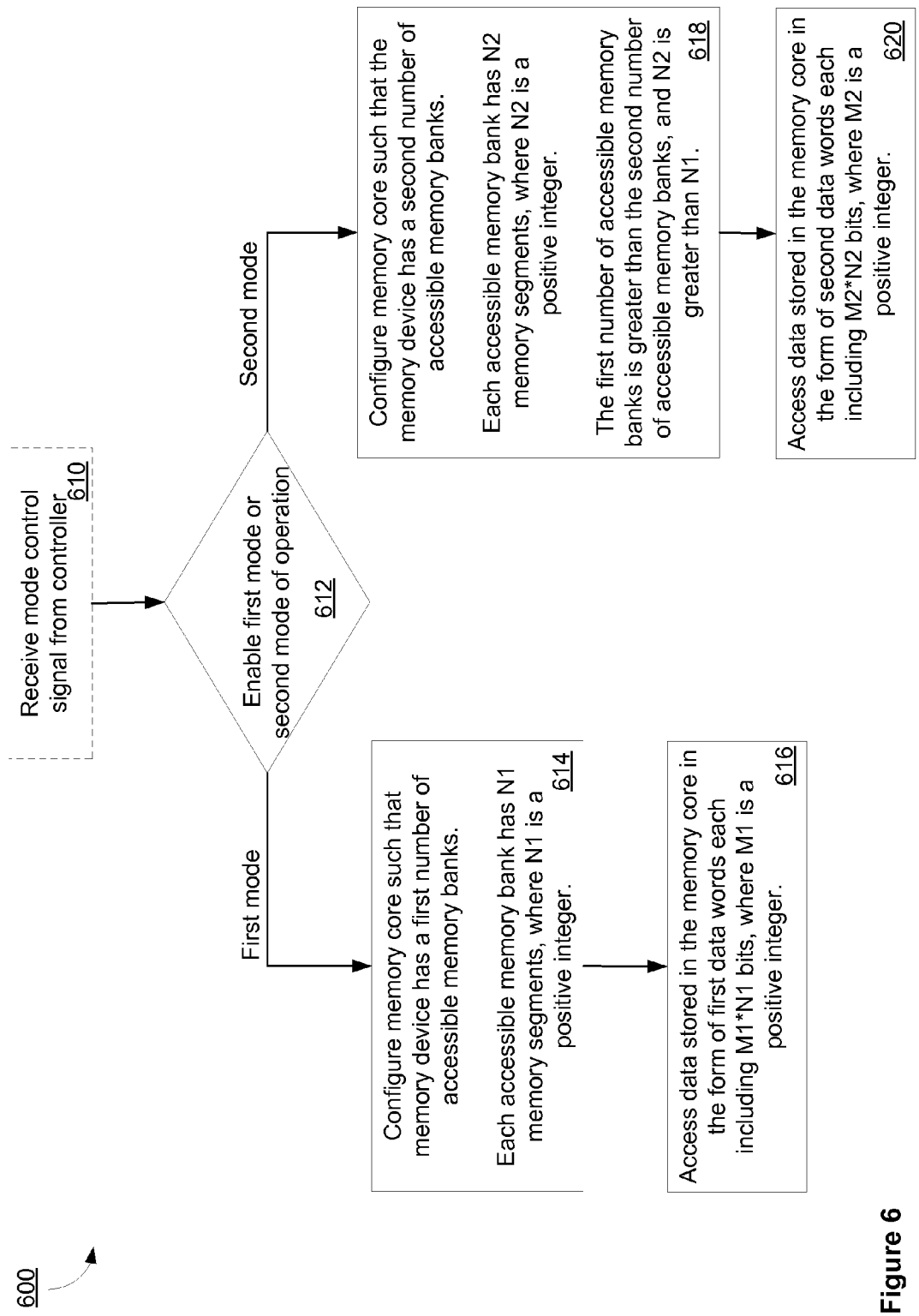
FIG. 6 is a flow diagram of a method of operating a memory device in accordance with some embodiments.

FIG. 6 is a flow diagram illustrating a process 600 of operating a memory device having a memory core in accordance with some embodiments. Process 600 can be performed using the memory device 100 described above with reference to FIGS. 1-4B. As shown in FIG. 6, the process 600 includes two modes of operation (First mode and Second mode). In the first mode of operation, the process 600 includes configuring the memory device such that the memory device has a first number of accessible memory banks (e.g., memory banks A1 to A9 in FIG. 2A) (614). In some embodiments, the first number is a positive multiple of 9 (e.g., 9, 18, 36, etc.) Each accessible memory bank has N1 memory segments (e.g., regular segments 202 or supplementary segments 204 (FIG. 2A)), where N1 is a positive integer (e.g., a positive multiple of 8). The process 600 further includes accessing data stored in the memory core in the form of first data words each including M1*N1 bits, where M1 is a positive integer (e.g., 1, 2, 4, 8, etc.) (616). In a second mode of operation the process 600 includes configuring the memory core such that the memory device has a second number of accessible memory banks (e.g., memory banks B1 to B8 in FIG. 2B) (618). In some embodiments, the second number is a positive multiple of 8 (e.g., 8, 16, 32, etc.) Each accessible memory bank has N2 memory segments, where N2 is a positive integer (e.g., a positive multiple of 9). The first number of accessible memory banks is greater than the second number of accessible memory banks, and N2 is greater than N1. The process 600 further includes accessing data stored in the memory core in the form of second data words each including M2*N2 bits, where M2 is a positive integer (620). In some, but not necessarily all, embodiments, M1 and M2 are equal.

In some embodiments, the process 600 further includes receiving a mode control signal (e.g., a mode control signal (Mode Control) (FIG. 3D)) from a controller (e.g., controller 352 (FIG. 3D)) (610). The mode control signal is used to enable the first mode of operation or the second mode of operation (612) in the memory device.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of operating a memory module, comprising:
providing a storage array having a plurality of memory banks and a first set of memory segments, wherein each of the plurality of memory banks includes a second set of memory segments;
in a first mode of operation, using the first set of memory segments as an additional memory bank; and
in a second mode of operation, accessing a memory segment in the first set of memory segments in parallel with a corresponding one of the plurality of memory banks;
wherein in the first mode of operation, each accessible memory bank of the memory module has a first number of memory segments accessible in parallel, and in the second mode of operation, each accessible memory bank of the memory module has a second number of memory segments accessible in parallel, wherein the second number is greater than the first number, and the first number of memory segments is an integer multiple of 8 and the second number of memory segments is an integer multiple of 9; and wherein a total number of memory segments accessible in the first mode of operation is the same as a total number of memory segments accessible in the second mode of operation.

2. The method of claim 1, further comprising, in the second mode of operation, accessing a pair of memory segments in the first set of memory segments as an additional set of memory segments in a corresponding one of the plurality of memory banks.

3. The method of claim 1, further comprising, in the second mode of operation, accessing a respective memory segment in the first set of memory segments as an additional memory segment in a corresponding one of the plurality of memory banks.

4. The method of claim 1, further comprising generating distinct control signals for each of the memory banks in the plurality of memory banks and for each of the memory segments in the first set of memory segments.

5. The method of claim 4, further comprising generating two sets of control signals for the first set of memory segments, including a first set of control signals for the first mode of operation and a second set of control signals for the second mode of operation.

6. The method of claim 1, further comprising providing a number of data pins coupled to the storage array, wherein the number of data pins is equal to a number of simultaneously accessed data bits in the second mode of operation.

7. The method of claim 6, further comprising disabling at least one of the number of data pins in the first mode of operation.

8. The method of claim 1, further including, in the second mode of operation, storing error correction or error detection codes in the first set of memory segments.

9. The method of claim 1, further including, in the second mode of operation, at least one memory segment of the first and second sets of memory segments is used to store error correction or error detection codes.

10. A memory device, comprising:
a storage array having a first number of accessible memory banks in a first mode of operation and a second number of memory accessible memory banks in a second mode of operation;
wherein, in the first mode of operation, each of the first number of accessible memory banks is comprised of a first number of memory segments;
wherein, in the second mode of operation, each of the second number of accessible memory banks is comprised of a second number of memory segments, and the first number of memory segments is an integer multiple of 8 and the second number of memory segments is an integer multiple of 9;
wherein the first number of accessible memory banks is greater than the second number of accessible memory banks, and the second number of memory segments is greater than the first number of memory segments; and
wherein a total number of memory segments accessible in the first mode of operation is the same as a total number of memory segments accessible in the second mode of operation.

11. The memory device of claim 10, further comprising mode control circuitry coupled to the storage array to generate distinct control signals for the first mode of operation and the second mode of operation.

12. The memory device of claim 10, further comprising a number of data pins coupled to the storage array, wherein the number of data pins is equal to a number of simultaneously accessed data bits in the second mode of operation.

13. The memory device of claim 12, wherein at least one of the number of data pins is disabled in the first mode of operation.

14. The memory device of claim 10, wherein at least one memory segment in each of the second number of accessible memory banks is used to store error correction or error detection codes in the second mode of operation.

15. A method of operating a memory device having a memory core, comprising:
in a first mode of operation:
configuring the memory core such that the memory device is comprised of a first number of accessible memory banks and that each of the first number of accessible memory banks is comprised of N1 memory segments, where N1 is a positive integer, and accessing data stored in the memory core in the form of first data words each including M1*N1 bits, wherein M1 is a positive integer; and
in a second mode of operation:
configuring the memory core such that the memory device is comprised of a second number of accessible memory banks and that each of the second number of accessible memory banks is comprised of N2 memory segments, where N2 is a positive integer; and
accessing data stored in the memory core in the form of second data words each including M2*N2 bits, wherein M2 is a positive integer;
wherein the first number of accessible memory banks is greater than the second number of accessible memory banks, N2 is greater than N1, and N1 is an integer multiple of 8 and N2 is an integer multiple of 9; and
wherein a total number of memory segments accessible in the first mode of operation is the same as a total number of memory segments accessible in the second mode of operation.

16. The method of claim 15, further comprising:
receiving a mode control signal from a controller, wherein the mode control signal is used to enable one of the first mode of operation or the second mode of operation.

17. A memory device, comprising:
a storage array having a plurality of accessible memory banks and a configurable first set of memory segments, the plurality of accessible memory banks each including a respective second set of memory segments distinct from the configurable first set of memory segments; and
wherein, in a first mode of operation, the configurable first set of memory segments is configured to be a single additional accessible memory bank;
wherein, in a second mode of operation, first, second, third and fourth memory segments in the configurable first set of memory segments are configured to be accessed in parallel with first, second, third and fourth memory banks of the plurality of accessible memory banks, respectively;
wherein, in the first mode of operation, each accessible memory bank of the memory device has a first number of memory segments accessible in parallel, and in the second mode of operation, each accessible memory bank of the memory device has a second number of memory segments accessible in parallel, wherein the second number is greater than the first number; and wherein a total number of memory segments accessible in the first mode of operation is the same as a total number of memory segments accessible in the second mode of operation.

18. The memory device of claim 17, wherein, in the second mode of operation, each memory segment in the first set of memory segments is configured to be an additional segment of a corresponding one of the plurality of accessible memory banks.

19. The memory device of claim 17, wherein each memory segment in the first set of memory segments is coupled to a distinct word line driver.

20. The memory device of claim 17, wherein the first set of memory segments includes a plurality memory segment pairs, and wherein each respective memory segment pair in the first set of memory segments is coupled to a respective word line driver.

21. The memory device of claim 17, wherein the first set of memory segments are used to store error correction or error detection codes in the second mode of operation.

22. The memory device of claim 17, wherein at least one memory segment of the first and second sets of memory segments is used to store error correction or error detection codes in the second mode of operation.

23. The memory device of claim 17, further comprising mode control circuitry coupled to the storage array to generate distinct control signals for each of the memory banks in the plurality of accessible memory banks and for each of the memory segments in the first set of memory segments.

24. The memory device of claim 23, wherein the mode control circuitry is configured to generate two sets of control signals for the first set of memory segments, including a first set of control signals for the first mode of operation and a second set of control signals for the second mode of operation.

25. The memory device of claim 17, further comprising a number of data pins coupled to the storage array, wherein the number of data pins is equal to a number of simultaneously accessed data bits in the second mode of operation.

26. The memory device of claim 25, wherein at least one of the number of data pins is disabled in the first mode of operation.

* * * * *